(12) United States Patent
Lin et al.

(10) Patent No.: US 9,184,134 B2
(45) Date of Patent: Nov. 10, 2015

(54) METHOD OF MANUFACTURING A SEMICONDUCTOR DEVICE STRUCTURE

(71) Applicant: Taiwan Semiconductor Manufacturing Co., Ltd, Hsin-Chu (TW)

(72) Inventors: Chi-Feng Lin, Hsinchu (TW); Chih-Chien Chi, Hsinchu (TW); Ching-Hua Hsieh, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/161,959

(22) Filed: Jan. 23, 2014

(65) Prior Publication Data

US 2015/0206840 A1  Jul. 23, 2015

(51) Int. Cl.
*H01L 21/00* (2006.01)
*H01L 23/538* (2006.01)
*H01L 21/768* (2006.01)

(52) U.S. Cl.
CPC .......... *H01L 23/538* (2013.01); *H01L 21/7684* (2013.01); *H01L 21/7685* (2013.01); *H01L 21/76877* (2013.01)

(58) Field of Classification Search
CPC ............... H01L 21/78873; H01L 21/76877; H01L 21/76816; H01L 29/78672; H01L 29/04; H01L 29/66765; H01L 21/7684; H01L 21/768; H01L 23/53

USPC ........... 257/750, 401, 758; 438/653, 637, 687
See application file for complete search history.

(56) References Cited

U.S. PATENT DOCUMENTS

| | | | |
|---|---|---|---|
| 5,652,156 A * | 7/1997 | Liao et al. ...................... | 438/161 |
| 6,297,154 B1 * | 10/2001 | Gross et al. ................... | 438/663 |
| 6,362,511 B1 * | 3/2002 | Mizushima et al. ........... | 257/412 |
| 6,555,204 B1 * | 4/2003 | Naeem et al. .................. | 428/192 |
| 6,903,008 B2 * | 6/2005 | Abe ............................... | 438/637 |
| 7,189,650 B2 * | 3/2007 | Liu et al. ........................ | 438/687 |
| 7,525,152 B2 * | 4/2009 | Dragon et al. ................. | 257/341 |
| 7,843,063 B2 * | 11/2010 | Baker-O'Neal et al. ...... | 257/751 |
| 7,956,463 B2 * | 6/2011 | Yang et al. ..................... | 257/751 |
| 8,420,537 B2 * | 4/2013 | Chanda et al. ................. | 438/692 |
| 2005/0227479 A1 * | 10/2005 | Feng et al. ..................... | 438/637 |
| 2009/0206484 A1 * | 8/2009 | Baker-O'Neal et al. ...... | 257/751 |
| 2009/0297759 A1 * | 12/2009 | Chanda et al. .................. | 428/83 |
| 2010/0133700 A1 * | 6/2010 | Werner et al. .................. | 257/774 |
| 2012/0146220 A1 * | 6/2012 | Sasajima et al. ............... | 257/741 |

* cited by examiner

*Primary Examiner* — Nikolay Yushin
(74) *Attorney, Agent, or Firm* — Birch, Stewart, Kolasch & Birch, LLP

(57) ABSTRACT

Embodiments of mechanisms for forming a semiconductor device structure are provided. The semiconductor device structure includes a semiconductor substrate. The semiconductor device structure further includes a dielectric layer on the semiconductor substrate. The semiconductor device structure also includes at least one conductive structure embedded in the dielectric layer. A plurality of crystal grains are composed of the conductive structure, and a ratio of an average grain size of the crystal grains to a width of the conductive structure ranges from about 0.75 to about 40.

20 Claims, 8 Drawing Sheets

US 9,184,134 B2

METHOD OF MANUFACTURING A SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor device structures with smaller and smaller sizes.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
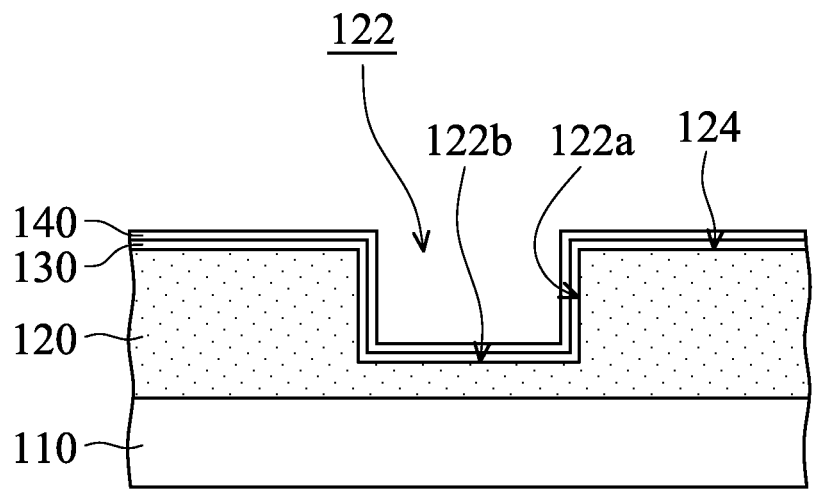
FIGS. 1A-1E are cross-sectional views of various stages of a process for forming a semiconductor device structure, in accordance with some embodiments.
Figure 1B:
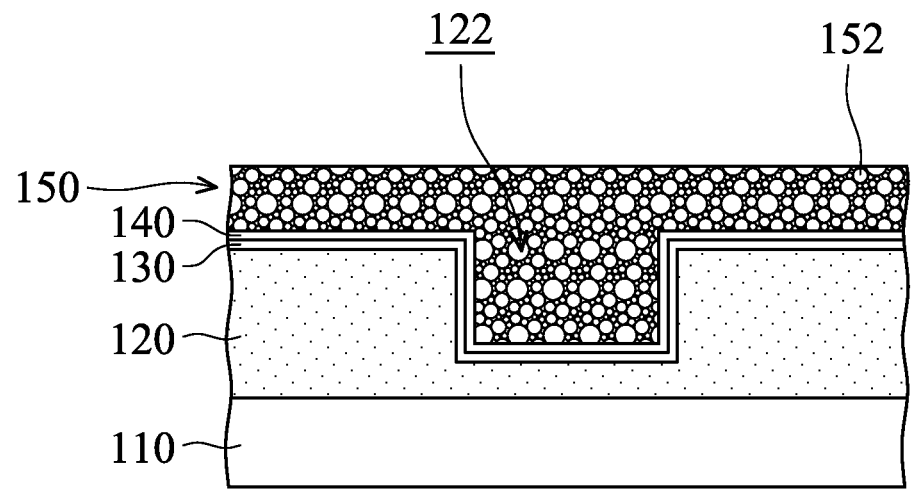
Figure 1C:
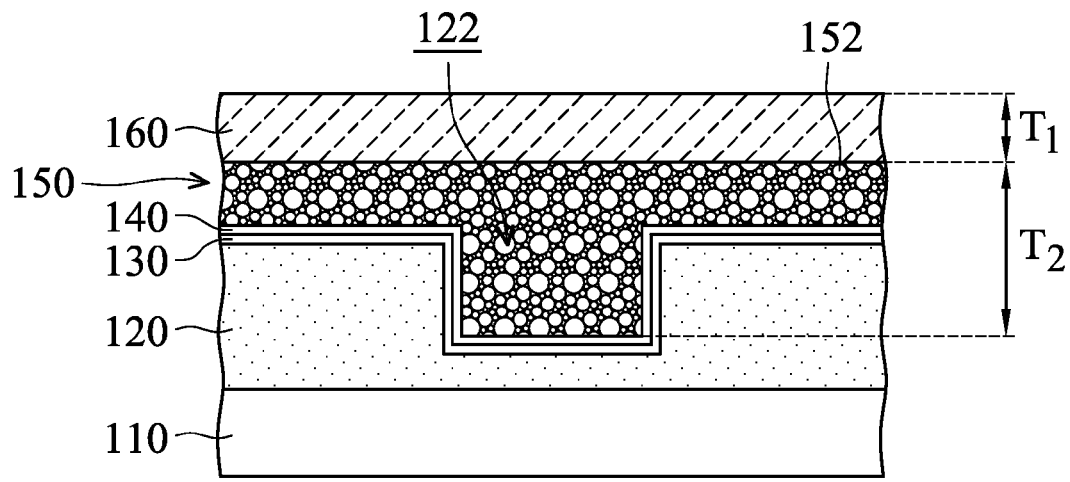
Figure 1D:
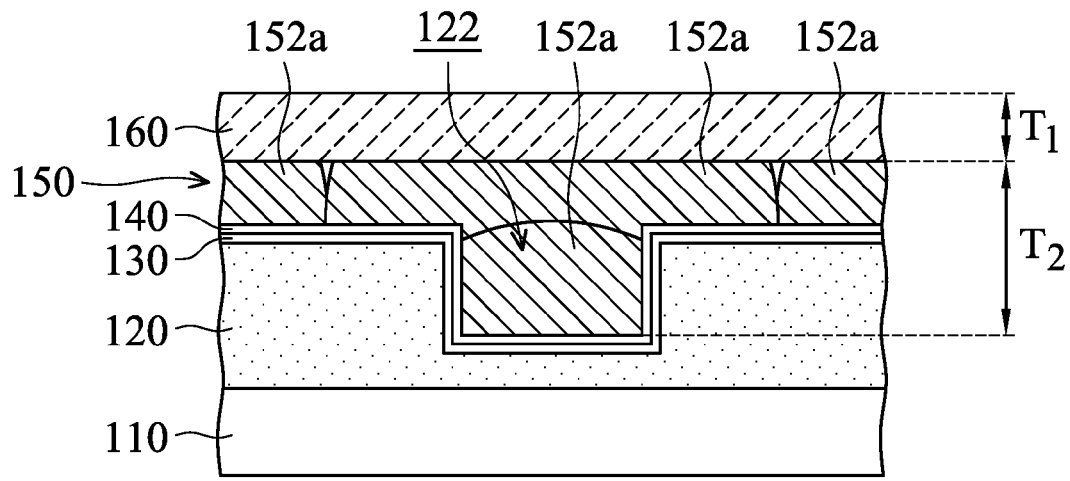
Figure 1E:
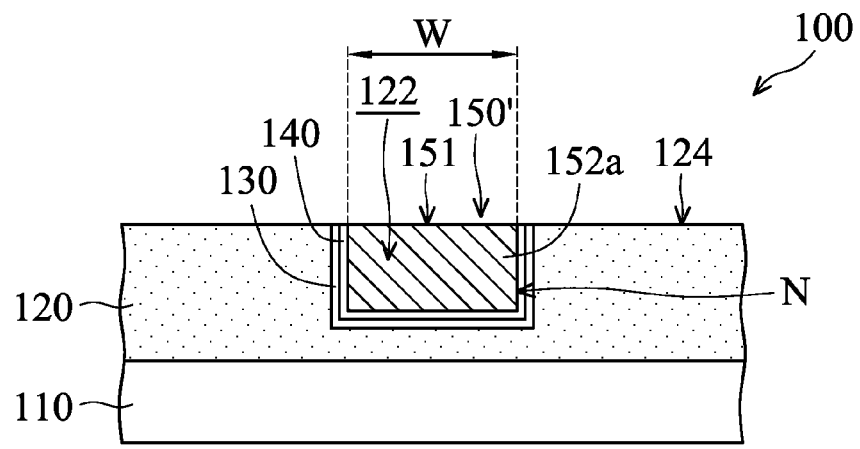
Figure 2:
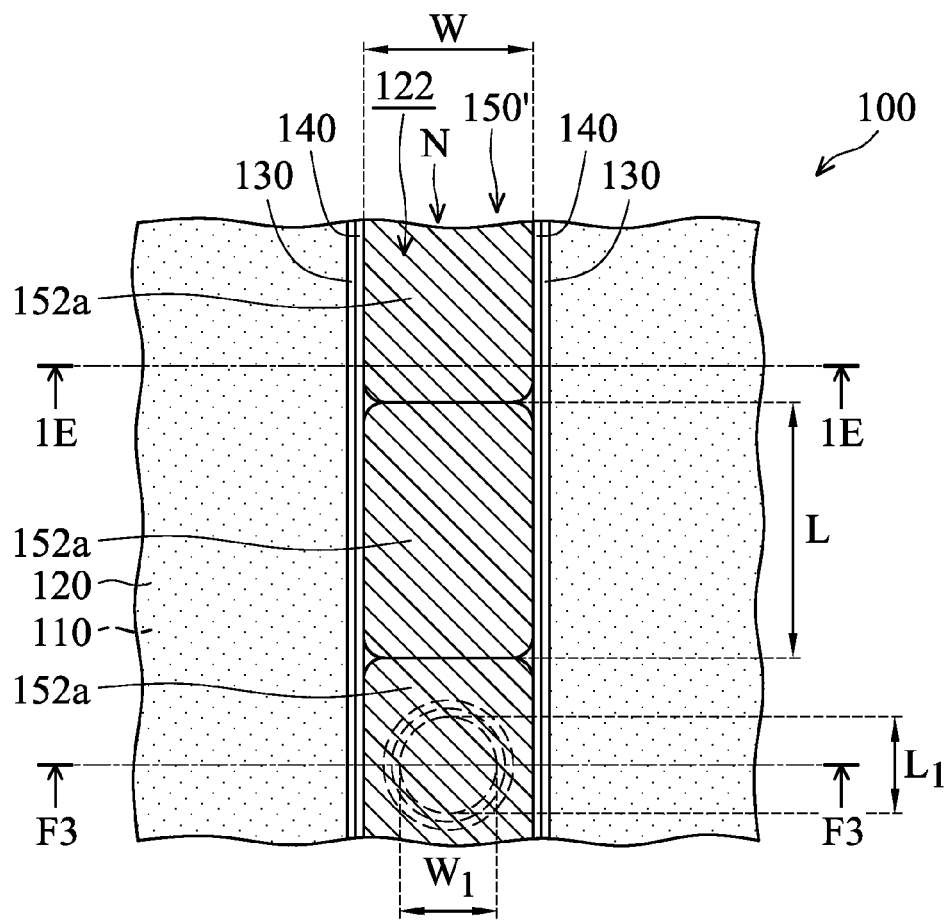
FIG. 2 is a top view of the semiconductor device structure of FIG. 1E, in accordance with some embodiments.
Figure 3:
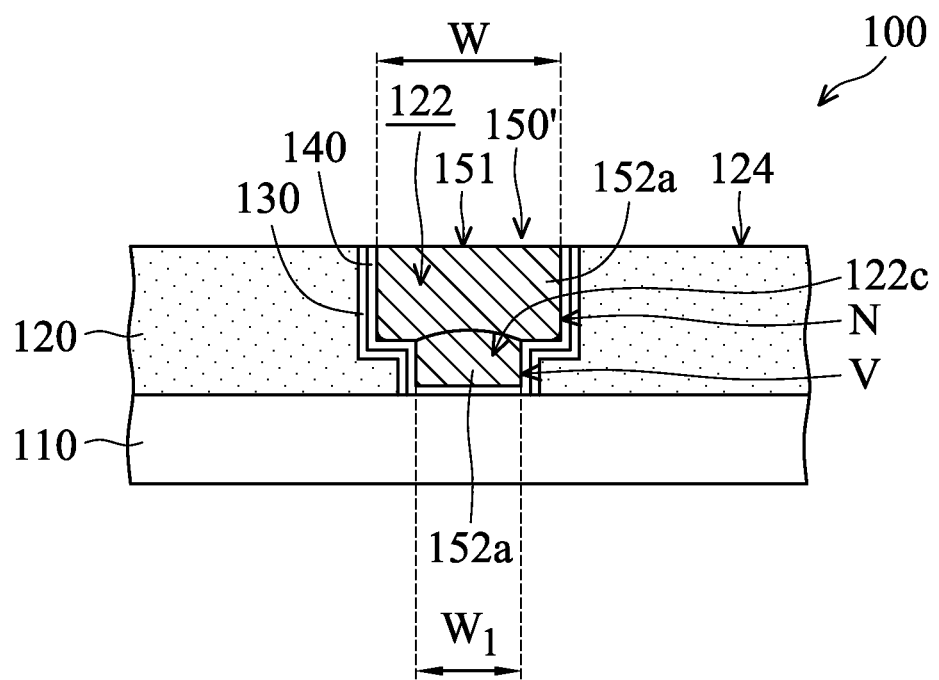
FIG. 3 is a cross-sectional view of a semiconductor device structure along a sectional line F3-F3 shown in FIG. 2, in accordance with some embodiments.

FIGS. 1A-1E are cross-sectional views of various stages of a process for forming a semiconductor device structure 100, in accordance with some embodiments. FIG. 2 is a top view of the semiconductor device structure 100 of FIG. 1E, and FIG. 1E is a cross-sectional view of the semiconductor device structure 100 along a sectional line 1E-1E shown in FIG. 2, in accordance with some embodiments. FIG. 3 is a cross-sectional view of the semiconductor device structure 100 along a sectional line F3-F3 shown in FIG. 2, in accordance with some embodiments.

As shown in FIG. 1A, a semiconductor substrate 110 is provided, in accordance with some embodiments. The semiconductor substrate 110 is a semiconductor wafer (such as a silicon wafer) or a portion of a semiconductor wafer, in accordance with some embodiments.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. The semiconductor substrate 110 may also include multi-layer semiconductors, semiconductor on insulator (SOI) (such as silicon on insulator or germanium on insulator), or a combination thereof.

In some embodiments, a dielectric layer 120 is then deposited over the semiconductor substrate 110, in accordance with some embodiments. The dielectric layer 120 is made of any suitable dielectric material, such as hydrogenated silicon oxycarbide (SiCO:H), silicon oxynitride, silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments.

The dielectric layer 120 is deposited by any suitable process, such as a CVD process, HDPCVD process, spin-on process, sputtering process, or combinations thereof, in accordance with some embodiments. Thereafter, a trench 122 is formed in the dielectric layer 120, in accordance with some embodiments. In some embodiments, the trench 122 is formed by a photolithography process and an etching process.

Afterwards, a barrier layer 130 is formed on a surface 124 of the dielectric layer 120, and a sidewall 122a and a bottom surface 122b of the trench 122, in accordance with some embodiments. The barrier layer 130 is configured to block the diffusion of metal atoms of a metal layer subsequently formed on the barrier layer 130, in accordance with some embodiments.

In some embodiments, the barrier layer 130 includes titanium, titanium nitrides, tantalum, tantalum nitrides or other suitable materials. In some embodiments, the barrier layer 130 is formed by a physical vapor deposition (PVD) process, a chemical vapor deposition (CVD) process, an electroless plating process or another suitable process.

Thereafter, a seed layer 140 is formed on the barrier layer 130, in accordance with some embodiments. The seed layer 140 includes copper, copper alloys, cobalt (Co), ruthenium (Ru) or other suitable conductive materials, in accordance with some embodiments. In some embodiments, the seed layer 140 is formed by a physical vapor deposition (PVD) process, a chemical vapor deposition (CVD) process, an electroless plating process or another suitable process.

Afterwards, as shown in FIG. 1B, a conductive layer 150 is deposited on the dielectric layer 120 to fill the trench 122, in accordance with some embodiments. In some embodiments, the conductive layer 150 is made of any suitable conductive material, such as copper, a copper alloy, silver, gold, or a combination thereof. The conductive layer 150 is deposited by any suitable process, such as an electrochemical plating process.

Thereafter, as shown in FIG. 1C, a stress layer 160 is formed on the conductive layer 150, in accordance with some embodiments. The stress layer 160 is configured to apply a stress (such as a tensile stress) to the conductive layer 150 during a subsequent annealing process, in accordance with some embodiments. In some embodiments, a coefficient of thermal expansion (CTE) of the stress layer 160 is smaller than that of the conductive layer 150.

In some embodiments, a difference in the coefficient of thermal expansion of the conductive layer 150 and the stress layer 160 ranges from about 0.1 μm/m-° C. to about 20 μm/m-° C. In some embodiments, the difference in the coefficient of thermal expansion of the conductive layer 150 and the stress layer 160 ranges from about 5 μm/m-° C. to about 15 μm/m-° C. In some embodiments, the conductive layer 150 is made of copper, and the coefficient of thermal expansion of the stress layer 160 is less than about 16.4 μm/m-° C.

In some embodiments, a ratio of a thickness T1 of the stress layer 160 to a thickness T2 of the conductive layer 150 ranges from about 0.2 to about 3. In some embodiments, the ratio of the thickness T1 of the stress layer 160 to the thickness T2 of the conductive layer 150 ranges from about 0.3 to about 1. In some embodiments, the thickness T1 of the stress layer 160 ranges from about 20 nm to about 1000 nm. In some embodiments, the thickness T1 of the stress layer 160 ranges from about 50 nm to about 300 nm.

The stress layer 160 includes metals (such as tantalum or titanium), metal nitrides (such as tantalum nitride or titanium nitride) or other suitable materials with a coefficient of thermal expansion smaller than that of the conductive layer 150, in accordance with some embodiments. The stress layer 160 is formed by a physical vapor deposition (PVD) process, a chemical vapor deposition (CVD) process, an electroless plating process or another suitable process, in accordance with some embodiments.

As shown in FIGS. 1C and 1D, an annealing process is performed, in accordance with some embodiments. During the annealing process, a stress (such as a tensile stress) from the stress layer 160 is applied to the conductive layer 150 due to the difference in coefficient of thermal expansion (CTE) of the stress layer 160 and the conductive layer 150, in accordance with some embodiments.

The stress facilitates the combination of the crystal grains 152 in the conductive layer 150 so as to form crystal grains 152a with a larger average grain size than that of the crystal grains 152 in the annealing process, in accordance with some embodiments. In some embodiments, as the difference in the coefficient of thermal expansion of the conductive layer 150 and the stress layer 160 is larger, the stress is larger as well. In some embodiments, as the difference in the coefficient of thermal expansion of the conductive layer 150 and the stress layer 160 is larger, the average grain size of the crystal grains 152a is larger as well.

In some embodiments, the process temperature of the annealing process ranges from about 200° C. to about 500° C. In some embodiments, the processing time of the annealing process ranges from about 30 seconds to about 30 minutes.

As shown in FIGS. 1E and 2, the stress layer 160 and portions of the conductive layer 150, the seed layer 140 and the barrier layer 130 outside of the trench 122 are removed, in accordance with some embodiments. In some embodiments, the stress layer 160 is removed by a chemical-mechanical polishing (CMP) process or another suitable process.

In some embodiments, portions of the conductive layer 150, the seed layer 140 and the barrier layer 130 outside of the trench 122 are removed by a CMP process or another suitable process. The portion of the conductive layer 150 remaining in the trench 122 composes a conductive structure 150', in accordance with some embodiments. In some embodiments, the conductive structure 150' includes a conductive line N. The conductive structure 150' is embedded in the dielectric layer 120, in accordance with some embodiments. In some embodiments, a top surface 151 of the conductive structure 150' is aligned with the top surface 124 of the dielectric layer 120.

In some embodiments, an average grain size of the crystal grains 152a is equal to the sum of the grain lengths (e.g., L) of the crystal grains 152a divided by the number of the crystal grains 152a. The lengths (e.g., L) of the crystal grains 152a are lengths in an extending direction of the conductive structure 150', in accordance with some embodiments.

In some embodiments, a ratio of the average grain size of the crystal grains 152a to a width (e.g., a line width) W of the conductive structure 150' ranges from about 0.75 to about 40. In some embodiments, the ratio of the average grain size of the crystal grains 152a to the width W of the conductive structure 150' ranges from about 1.5 to about 20.

In some embodiments, the average grain size of the crystal grains 152a is larger than the width W of the conductive structure 150'. In some embodiments, the ratio of the average grain size of the crystal grains 152a to the width W of the conductive structure 150' is larger than about 1. In some embodiments, the ratio of the average grain size of the crystal grains 152a to the width W of the conductive structure 150' is larger than about 1 and smaller than or equal to about 20.

In some embodiments, the width W of the conductive structure 150' ranges from about 30 nm to about 50 nm. In some embodiments, the width W of the conductive structure 150' ranges from about 35 nm to about 45 nm. In some embodiments, the average grain size of the crystal grains 152a ranges from about 30 nm to about 300 nm. The ratio of the average grain size of the crystal grains 152a to the width W of the conductive structure 150' ranges from about 0.75 to about 7.5, in accordance with some embodiments.

In some embodiments, the average grain size of the crystal grains 152a ranges from about 60 nm to about 150 nm. The ratio of the average grain size of the crystal grains 152a to the width W of the conductive structure 150' ranges from about 1.5 to about 3.75, in accordance with some embodiments.

In some embodiments, the width W of the conductive structure 150' ranges from about 55 nm to about 75 nm. In some embodiments, the width W of the conductive structure 150' ranges from about 60 nm to about 70 nm. In some embodiments, the average grain size of the crystal grains 152a ranges from about 75 nm to about 1000 nm. The ratio of the average grain size of the crystal grains 152a to the width W of the conductive structure 150' ranges from about 1.1 to about 15.3, in accordance with some embodiments.

In some embodiments, the average grain size of the crystal grains 152a ranges from about 150 nm to about 500 nm. The ratio of the average grain size of the crystal grains 152a to the width W of the conductive structure 150' ranges from about 2.3 to about 7.7, in accordance with some embodiments.

In some embodiments, the width W of the conductive structure 150' ranges from about 290 nm to about 310 nm. In some embodiments, the width W of the conductive structure 150' ranges from about 295 nm to about 305 nm. In some embodiments, the average grain size of the crystal grains 152a ranges from about 1000 nm to about 12000 nm. The ratio of the average grain size of the crystal grains 152a to the width W of the conductive structure 150' ranges from about 3 to about 40, in accordance with some embodiments.

In some embodiments, the average grain size of the crystal grains 152a ranges from about 3000 nm to about 6000 nm. The ratio of the average grain size of the crystal grains 152a to the width W of the conductive structure 150' ranges from about 10 to about 20, in accordance with some embodiments.

As shown in FIGS. 2 and 3, in some embodiments, the conductive structure 150' further includes a conductive via structure V in a recess 122c of the dielectric layer 120. The conductive via structure V is connected with the conductive line N, in accordance with some embodiments.

In some embodiments, an average grain size of the crystal grains 152a in the recess 122c is equal to the sum of the grain lengths (e.g., L1) of the crystal grains 152a in the recess 122c divided by the number of the crystal grains 152a in the recess 122c. The lengths (e.g., L1) of the crystal grains 152a in the recess 122c are lengths in an extending direction of the conductive structure 150', in accordance with some embodiments.

In some embodiments, a ratio of the average grain size of the crystal grains 152a in the recess 122c to a width W1 of the conductive via structure V is larger than or equal to 0.1 and smaller than or equal to about 1. In some embodiments, a ratio of the average grain size of the crystal grains 152a in the recess 122c to the width W1 of the conductive via structure V is larger than or equal to 0.3 and smaller than or equal to about 1.

In some embodiments, since the grain boundaries of the crystal grains in the conductive structure retard the flow of a current through the conductive structure, as the grain boundaries are increased, the resistance of the conductive structure is increased as well. In some embodiments, since cavities (or voids) tend to be formed on the grain boundaries, as the grain boundaries are increased, the reliability of the conductive structure is decreased as well.

In some embodiments, if there is no stress layer on the conductive layer 150 in the annealing process, the crystal grains 152 in the conductive layer 150 are combined into first crystal grains (not shown) larger than crystal grains 152 but smaller than the large crystal grains 152a (as shown in FIG. 1D). Therefore, the grain boundaries of the crystal grains 152a are less than that of the first crystal grains. As a result, the conductive structure 150' has a smaller resistance and a higher reliability than that of the conductive structure composited by the first crystal grains, in accordance with some embodiments.

Figure 4A:
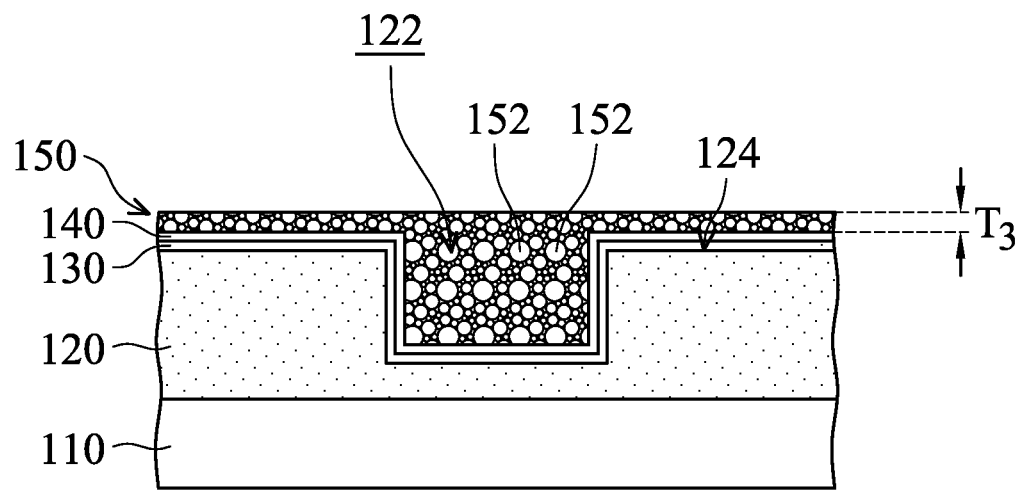
FIGS. 4A-4D are cross-sectional views of various stages of a process for forming a semiconductor device structure, in accordance with some embodiments.

FIGS. 4A-4D are cross-sectional views of various stages of a process for forming a semiconductor device structure 200, in accordance with some embodiments. As shown in FIG. 4A, after the step of FIG. 1B, a planarization process is performed on the conductive layer 150 to remove a portion of the conductive layer 150, in accordance with some embodiments. The planarization process includes a chemical-mechanical polishing process (CMP process) or other suitable planarization processes.

In some embodiments, the conductive layer 150 remaining on the surface 124 of the dielectric layer 120 has a thickness T3 ranging from about 1 Å to about 10000 Å. In some embodiments, the thickness T3 ranges from about 1 Å to about 6000 Å. In some embodiments, the thickness T3 ranges from about 2000 Å to about 4000 Å. In some embodiments, the thickness T3 ranges from about 5000 Å to about 6000 Å.

Figure 4B:
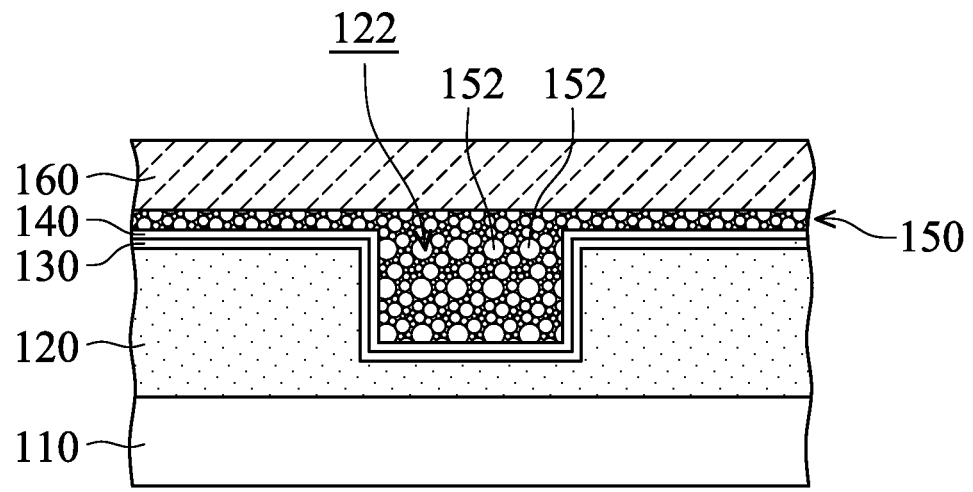
Figure 4C:
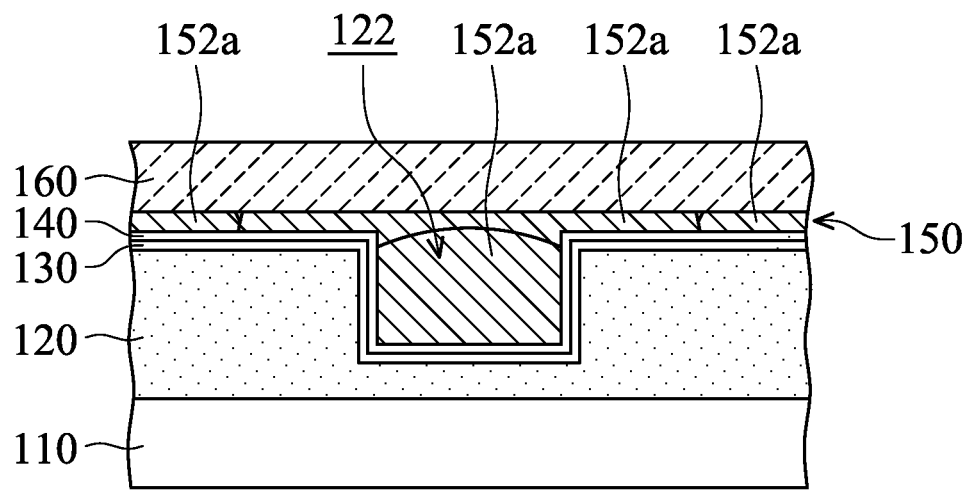

Thereafter, as shown in FIG. 4B, a stress layer 160 is formed on the conductive layer 150, in accordance with some embodiments. As shown in FIGS. 4B and 4C, an annealing process is performed, in accordance with some embodiments. During the annealing process, a stress (such as a tensile stress) from the stress layer 160 is applied to the conductive layer 150 due to the difference in coefficient of thermal expansion (CTE) of the stress layer 160 and the conductive layer 150, in accordance with some embodiments. The stress facilitates the combination of the crystal grains 152 in the conductive layer 150 so as to form crystal grains 152a with a larger average grain size than that of the crystal grains 152 in the annealing process, in accordance with some embodiments.

In some embodiments, since the planarization process plenarizes the conductive layer 150, the stress layer 160 uniformly applies the stress to the conductive layer 150. In some embodiments, since the planarization process thins the conductive layer 150, the stress layer 160 is more close to the recess 122 and therefore provides more stress to the conductive layer 150 in the recess 122, which increases the size of the crystal grains 152a in the recess 122.

Figure 4D:
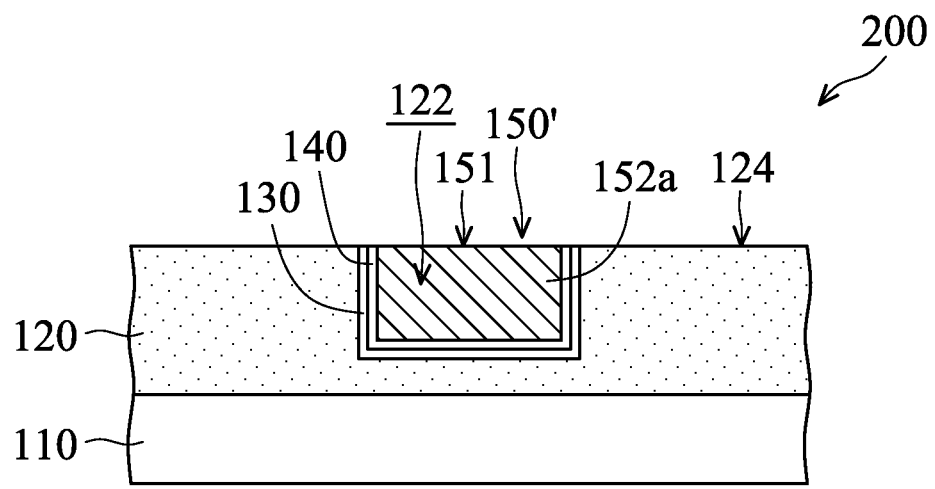

As shown in FIGS. 4C and 4D, the stress layer 160 and portions of the conductive layer 150, the seed layer 140 and the barrier layer 130 outside of the recess 122 are removed, in accordance with some embodiments. The portion of the conductive layer 150 remaining in the recess 122 composes a conductive structure 150', in accordance with some embodiments.

Figure 5A:
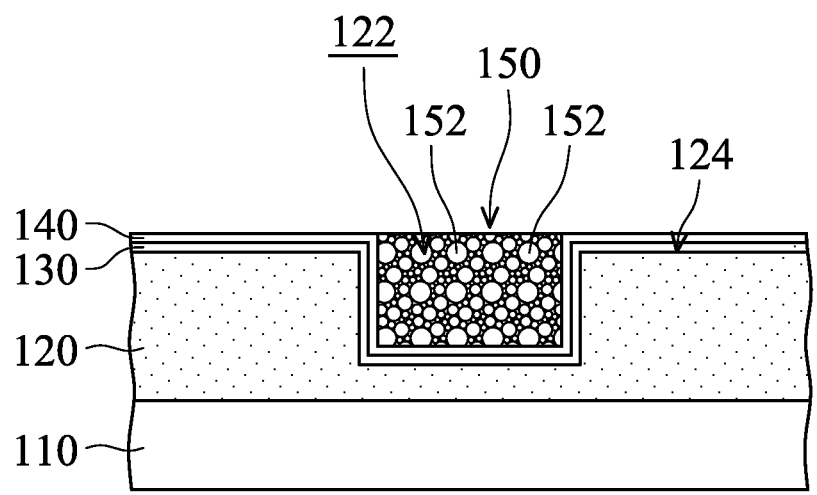
FIGS. 5A-5D are cross-sectional views of various stages of a process for forming a semiconductor device structure, in accordance with some embodiments.

FIGS. 5A-5D are cross-sectional views of various stages of a process for forming a semiconductor device structure 300, in accordance with some embodiments. As shown in FIG. 5A, after the step of FIG. 1B, a planarization process is performed on the conductive layer 150 to remove the conductive layer 150 on the surface 124, in accordance with some embodiments. The planarization process includes a chemical-mechanical polishing process (CMP process) or other suitable planarization processes.

Figure 5B:
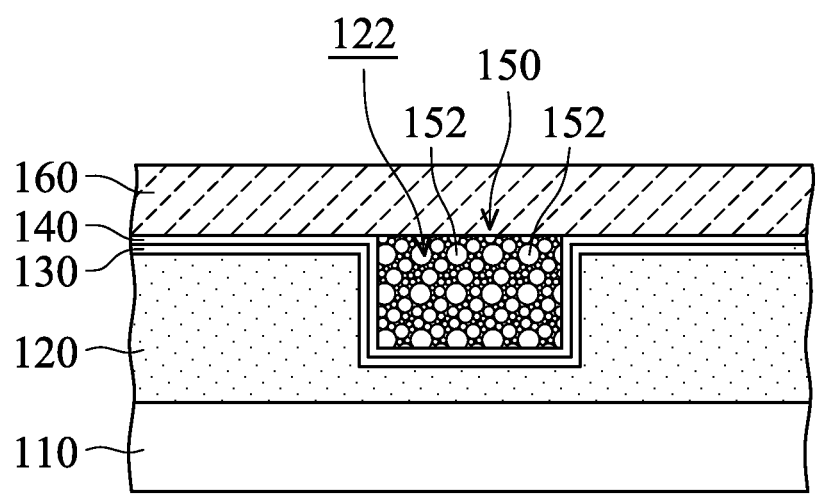
Figure 5C:
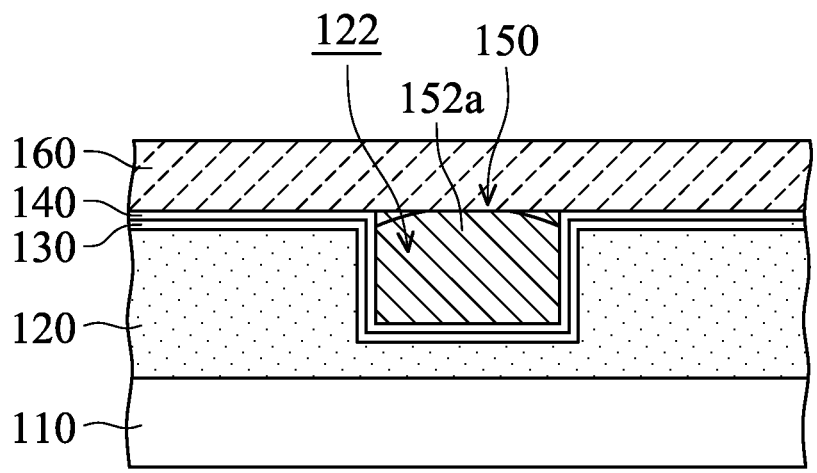

Thereafter, as shown in FIG. 5B, a stress layer 160 is formed on the conductive layer 150, in accordance with some embodiments. As shown in FIGS. 5B and 5C, an annealing process is performed, in accordance with some embodiments. During the annealing process, a stress (such as a tensile stress) from the stress layer 160 is applied to the conductive layer 150 due to the difference in coefficient of thermal expansion (CTE) of the stress layer 160 and the conductive layer 150, in accordance with some embodiments. The stress facilitates the combination of the crystal grains 152 in the conductive layer 150 so as to form crystal grains 152a with a larger average grain size than that of the crystal grains 152 in the annealing process, in accordance with some embodiments.

In some embodiments, since the planarization process plenarizes the conductive layer 150, the stress layer 160 uniformly applies the stress to the conductive layer 150. In some embodiments, since the planarization process thins the conductive layer 150, the stress layer 160 is more close to the recess 122 and therefore provides more stress to the conductive layer 150 in the recess 122, which increases the size of the crystal grains 152a in the recess 122.

Figure 5D:
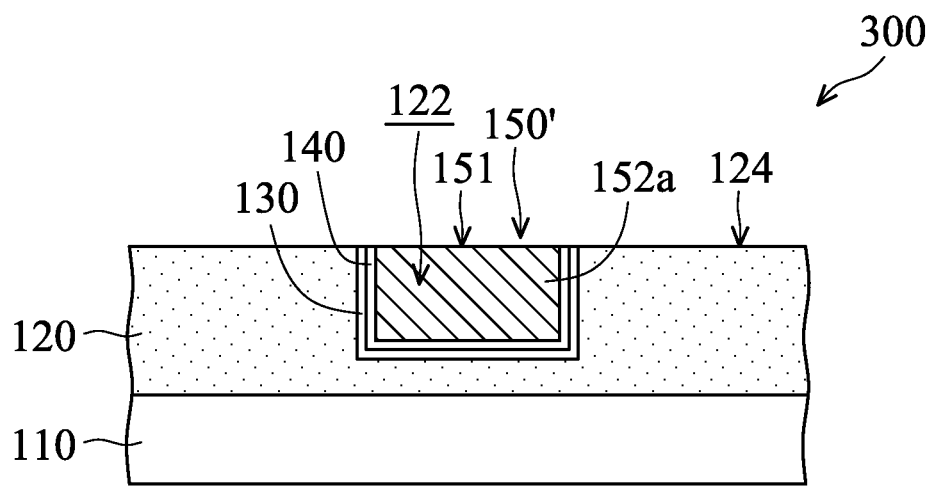

As shown in FIGS. 5C and 5D, the stress layer 160 and portions of the seed layer 140 and the barrier layer 130 outside of the recess 122 are removed, in accordance with some embodiments. The portion of the conductive layer 150 remaining in the recess 122 composes a conductive structure 150', in accordance with some embodiments.

In accordance with some embodiments, semiconductor device structures and methods for forming the same are provided. The methods (for forming the semiconductor device structure) form a stress layer on a conductive layer used to form a conductive structure, and the stress layer has a coefficient of thermal expansion different from a coefficient of thermal expansion of the conductive layer. During an annealing process, the stress layer applies a stress (such as a tensile stress) to the conductive layer to facilitate the combination of the crystal grains in the conductive layer so as to form larger crystal grains with less grain boundaries. Since the grain boundaries in the conductive layer are decreased, the conductive structure formed from the conductive layer has a small resistance and a high reliability.

In accordance with some embodiments, a semiconductor device structure is provided. The semiconductor device structure includes a semiconductor substrate. The semiconductor device structure further includes a dielectric layer on the semiconductor substrate. The semiconductor device structure also includes at least one conductive structure embedded in the dielectric layer. A plurality of crystal grains are composed of the conductive structure, and a ratio of an average grain size of the crystal grains to a width of the conductive structure ranges from about 0.75 to about 40.

In accordance with some embodiments, a semiconductor device structure is provided. The semiconductor device structure includes a semiconductor substrate. The semiconductor device structure further includes a dielectric layer on the semiconductor substrate. The semiconductor device structure also includes at least one conductive structure embedded in the dielectric layer. A plurality of crystal grains are composed of the conductive structure, and an average grain size of the crystal grains is larger than a width of the conductive structure.

In accordance with some embodiments, a method for forming a semiconductor device structure is provided. The method for forming a semiconductor device structure includes forming a dielectric layer on a semiconductor substrate, wherein the dielectric layer has at least one trench in the dielectric layer. The method for forming a semiconductor device structure also includes forming a conductive layer on the dielectric layer to fill the trench. The method for forming a semiconductor device structure further includes forming a stress layer on the conductive layer, wherein a coefficient of thermal expansion of the stress layer is smaller than that of the conductive layer. The method for forming a semiconductor device structure includes annealing the conductive layer and the stress layer. The method for forming a semiconductor device structure includes removing the stress layer and a portion of the conductive layer outside of the trench.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device structure, comprising:
   forming a dielectric layer on a semiconductor substrate, wherein the dielectric layer has at least one trench in the dielectric layer;
   forming a conductive layer on the dielectric layer to fill the trench;
   forming a stress layer on the conductive layer, wherein a coefficient of thermal expansion of the stress layer is smaller than that of the conductive layer;
   annealing the conductive layer and the stress layer; and
   removing the stress layer and a portion of the conductive layer outside of the trench.

2. The method for forming a semiconductor device structure as claimed in claim 1, wherein a difference in the coefficient of thermal expansion of the conductive layer and the stress layer ranges from about 0.1 μm/m-° C. to about 20 μm/m-° C.

3. The method for forming a semiconductor device structure as claimed in claim 2, wherein the difference in the coefficient of thermal expansion of the conductive layer and the stress layer ranges from about 5 μm/m-° C. to about 15 μm/m-° C.

4. The method for forming a semiconductor device structure as claimed in claim 1, wherein a ratio of a thickness of the stress layer to a thickness of the conductive layer ranges from about 0.2 to about 3.

5. The method for forming a semiconductor device structure as claimed in claim 4, wherein the ratio of the thickness of the stress layer to the thickness of the conductive layer ranges from about 0.3 to about 1.

6. The method for forming a semiconductor device structure as claimed in claim 1, wherein the formation of the conductive layer comprises performing an electrochemical plating process over the dielectric layer.

7. The method for forming a semiconductor device structure as claimed in claim 1, wherein the annealing of the conductive layer and the stress layer is performed at a temperature ranging from about 200° C. to about 500° C.

8. The method for forming a semiconductor device structure as claimed in claim 1, wherein after the removal of the stress layer and the portion of the conductive layer outside of the trench, a first top surface of the conductive layer is aligned with a second top surface of the dielectric layer.

9. A method for forming a semiconductor device structure, comprising:
   forming a dielectric layer on a semiconductor substrate, wherein the dielectric layer has at least one trench in the dielectric layer;
   forming a conductive layer on the dielectric layer to fill the trench;
   performing a planarization process on the conductive layer to remove a first portion of the conductive layer outside of the recess, wherein after the planarization process, a second portion of the conductive layer remains outside of the recess and over a top surface of the dielectric layer;

forming a stress layer on the conductive layer, wherein a coefficient of thermal expansion of the stress layer is smaller than that of the conductive layer;

annealing the conductive layer and the stress layer; and removing the stress layer and the second portion of the conductive layer.

10. The method for forming a semiconductor device structure as claimed in claim 9, further comprising:

before the formation of the conductive layer, forming a seed layer over the dielectric layer and in the trench, wherein the conductive layer is formed over the seed layer, and the removal of the stress layer and the second portion of the conductive layer further comprises removing the seed layer outside of the trench.

11. The method for forming a semiconductor device structure as claimed in claim 9, wherein a difference in the coefficient of thermal expansion of the conductive layer and the stress layer ranges from about 0.1 μm/m-° C. to about 20 μm/m-° C.

12. The method for forming a semiconductor device structure as claimed in claim 11, wherein the difference in the coefficient of thermal expansion of the conductive layer and the stress layer ranges from about 5 μm/m-° C. to about 15 μm/m-° C.

13. The method for forming a semiconductor device structure as claimed in claim 9, wherein during the annealing of the conductive layer and the stress layer, a tensile stress from the stress layer is applied to the conductive layer.

14. The method for forming a semiconductor device structure as claimed in claim 9, wherein during the annealing of the conductive layer and the stress layer, a plurality of first crystal grains of the conductive layer are combined with each other to form a plurality of second crystal grains, and a first average grain size of the second crystal grains is larger than a second average grain size of the first crystal grains.

15. A method for forming a semiconductor device structure, comprising:

forming a dielectric layer on a semiconductor substrate, wherein the dielectric layer has at least one trench in the dielectric layer;

forming a conductive layer on the dielectric layer to fill the trench;

performing a planarization process on the conductive layer to remove the conductive layer over a top surface of the dielectric layer;

forming a stress layer on the conductive layer, wherein a coefficient of thermal expansion of the stress layer is smaller than that of the conductive layer;

annealing the conductive layer and the stress layer; and removing the stress layer.

16. The method for forming a semiconductor device structure as claimed in claim 15, wherein the formation of the conductive layer comprises performing an electrochemical plating process over the dielectric layer.

17. The method for forming a semiconductor device structure as claimed in claim 15, wherein the annealing of the conductive layer and the stress layer is performed at a temperature ranging from about 200° C. to about 500° C.

18. The method for forming a semiconductor device structure as claimed in claim 15, wherein during the annealing of the conductive layer and the stress layer, a tensile stress from the stress layer is applied to the conductive layer.

19. The method for forming a semiconductor device structure as claimed in claim 15, wherein a difference in the coefficient of thermal expansion of the conductive layer and the stress layer ranges from about 0.1 μm/m-° C. to about 20 μm/m-° C.

20. The method for forming a semiconductor device structure as claimed in claim 19, wherein the difference in the coefficient of thermal expansion of the conductive layer and the stress layer ranges from about 5 μm/m-° C. to about 15 μm/m-° C.

* * * * *